United States Patent [19]

Harrison

[11] Patent Number: 5,390,334
[45] Date of Patent: Feb. 14, 1995

[54] WORKSTATION POWER MANAGEMENT BY PAGE PLACEMENT CONTROL

[75] Inventor: Colin G. Harrison, Brookfield, Conn.

[73] Assignee: International Business Machines Corporation, Armonk, N.Y.

[21] Appl. No.: 973,574

[22] Filed: Nov. 9, 1992

Related U.S. Application Data

[63] Continuation of Ser. No. 604,838, Oct. 29, 1990, abandoned.

[51] Int. Cl.⁶ .......................... G06F 1/32; G06F 12/00
[52] U.S. Cl. .................... 395/750; 395/425; 364/966.6; 364/948.91; 364/DIG. 2
[58] Field of Search ........... 395/750, 425, 575; 365/227; 371/66, 12, 14, 10.1; 364/707, 264.11, 273.1, 273.5, DIG. 1, 948.8, 948.91, 966.6, DIG. 2

[56] References Cited

U.S. PATENT DOCUMENTS

| | | | |
|---|---|---|---|
| 3,701,107 | 10/1972 | Williams | 395/425 |
| 4,186,438 | 1/1980 | Benson et al. | 395/600 |
| 4,277,826 | 7/1981 | Collins et al. | 395/400 |
| 4,463,424 | 7/1984 | Mattson et al. | 395/425 |
| 4,475,194 | 10/1984 | LaVallee et al. | 371/10.2 |
| 4,635,145 | 1/1987 | Horie et al. | 360/78 |
| 4,653,050 | 3/1987 | Vallancourt | 371/10.1 |
| 4,660,130 | 4/1987 | Bartley et al. | 395/400 |
| 4,680,703 | 7/1987 | Kriz | 395/425 |
| 4,736,287 | 4/1988 | Druke et al. | 395/425 |
| 4,737,867 | 4/1988 | Ishikawa et al. | 360/69 |
| 4,758,944 | 7/1988 | Bartley et al. | 395/425 |
| 4,868,734 | 9/1989 | Idelman et al. | 395/275 |
| 4,984,150 | 1/1991 | Mori | 395/575 |
| 5,091,850 | 2/1992 | Culley | 395/400 |
| 5,157,774 | 10/1992 | Culley | 395/425 |
| 5,175,834 | 12/1992 | Sawai | 395/425 |
| 5,218,686 | 6/1993 | Thayer | 395/425 |
| 5,226,009 | 7/1993 | Arimoto | 365/189.04 |
| 5,226,147 | 7/1993 | Fujishima et al. | 395/425 |
| 5,249,282 | 9/1993 | Segers | 395/425 |

OTHER PUBLICATIONS

Bolosky et al., *Simple But Effective Techniques for NUMA Memory Management*, accepted for presentation at the 1989 ACM Symposium on Operating System Principles.

*Primary Examiner*—Jack B. Harvey
*Assistant Examiner*—Glenn A. Auve
*Attorney, Agent, or Firm*—Sterne, Kessler, Goldstein & Fox, Richard M. Ludwin

[57] ABSTRACT

A power conserving method and apparatus for managing a computer memory. A first memory bank comprises normal RAM. A second memory bank comprises low-power RAM. More frequently used virtual pages are mapped onto the first memory bank while less frequently used virtual pages are mapped onto the second memory bank. Further power savings are achieved by removing power from the driver circuits of the memory controller for the second memory bank when the second memory bank is not being referenced.

9 Claims, 4 Drawing Sheets

WORKSTATION POWER MANAGEMENT BY PAGE PLACEMENT CONTROL

This application is a continuation, of application Ser. No. 07/604,838, filed Oct. 29, 1990, now abandoned.

FIELD OF THE INVENTION

This invention relates to power conservation techniques for workstations. More particularly, this invention relates to battery-operated workstations having a page-oriented operating system. It should be understood that this invention will be useful in other page-oriented storage systems.

BACKGROUND DISCUSSION

In order to obtain true portability in micro-computers and workstations, battery power is essential. Moreover, given the capacity versus size limitations of known batteries, it is essential to minimize total power consumption in order to extend the operating life of the batteries.

It is relatively easy to reduce battery consumption by an initial 60 to 70 percent. This initial savings can be accomplished by simply turning selected pieces of hardware off when they are not being used. The last 30 to 40 percent savings becomes increasingly more difficult to achieve, while simultaneously becoming increasingly more valuable in terms of extending battery life. This is due to the inverse relationship between battery life and battery load. Accordingly, savings that would seem trivial in off-line applications, might be momentous in a battery powered environment.

Further reduction in total power consumption may be achieved by replacing high power hardware with low power consuming hardware. Normally, however, this involves a tradeoff of performance. For example, the power consumption of random access memory (RAM) is generally a function of how fast the memory is. Very fast RAM will consume relatively large amounts of power, while slower RAM will generally use less power. Thus, while overall power consumption may be reduced in this manner, it is done at a sacrifice of performance.

In the past, computer memories have been managed for efficiency whereby infrequently needed blocks of memory were collected and paged out to disk, while frequently used blocks were collected and maintained in main memory for efficient access. U.S. Pat. Nos. 4,660,130 and 4,758,944, both to Bartley et al. are exemplary of such conventional memory management methods.

SUMMARY OF THE INVENTION

In light of the above, the present invention provides a method and apparatus for managing computer memory such that low power consumption is achieved without the corresponding loss of performance.

A computer memory is divided into two memory banks. The first memory bank comprises normal RAM. The second memory bank comprises low-power RAM. The memory controller for the low-power memory is operable such that the driver circuits may be powered down independent of the memory controller logic. Power is removed from the driver circuits when the second memory bank is not being referenced to allow for further power savings in the low-power memory.

Pages of virtual memory are then mapped onto the memory banks according to their frequency of reference. More frequently used pages are mapped onto the normal memory while less frequently used pages are mapped onto the low-power memory.

ADVANTAGES OF THE PRESENT INVENTION

It is an advantage of the present invention that power consumption of a computer memory is reduced without a corresponding degradation in system performance.

It is another advantage that less expensive components may be used in a portion of the physical memory of a computer without a corresponding degradation in system performance.

PREFERRED EMBODIMENT OF THE PRESENT INVENTION

Figure 1:
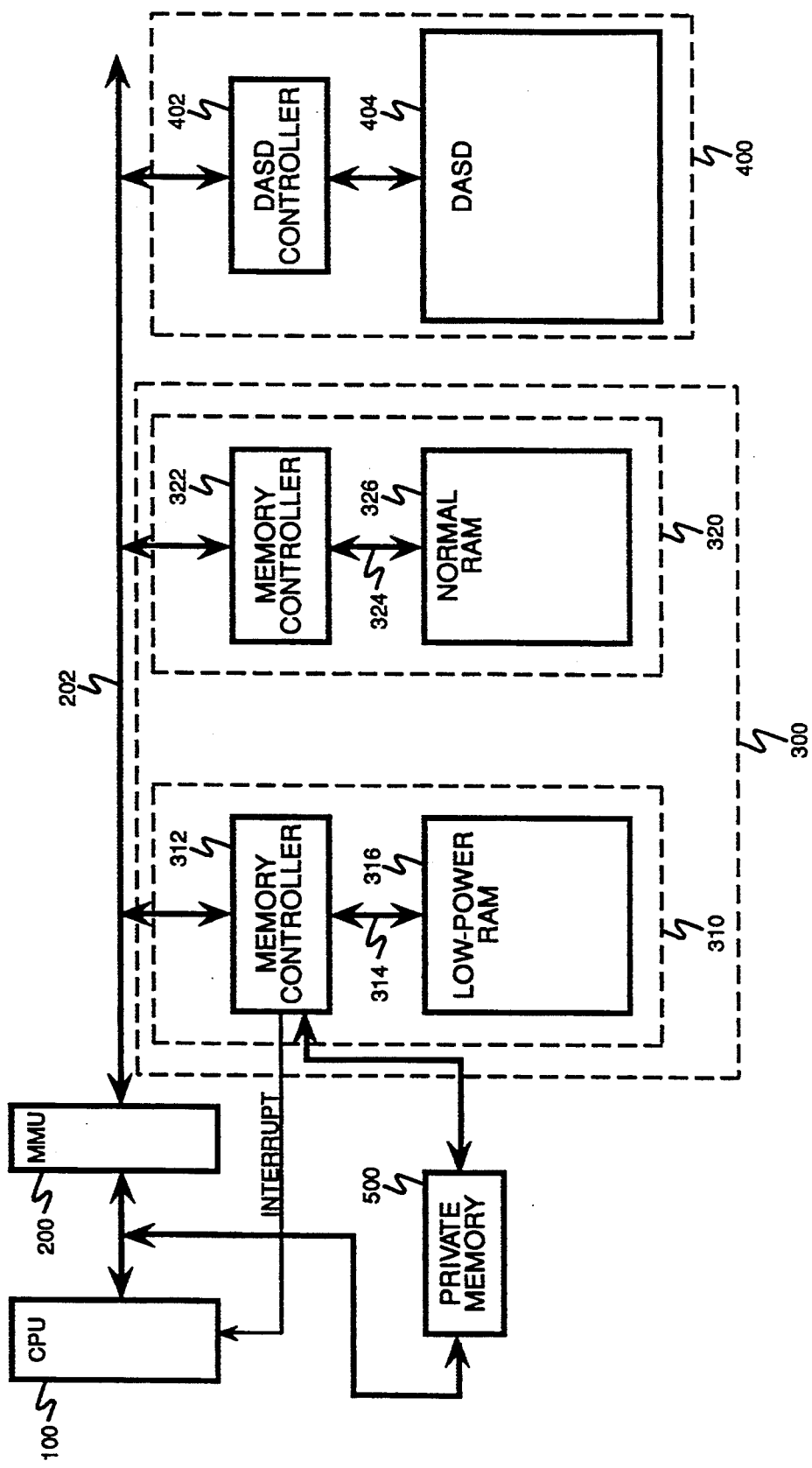
FIG. 1 is a block diagram representing the structural elements of the apparatus of the present invention.

Ideally, a computer would have a very large, very fast memory. Unfortunately, memory speed is inversely related to memory capacity, and the cost per bit for very fast memories is extremely high. These limitations dictate that most computers will utilize virtual memory.

A virtual memory system uses random access memory, a mass storage system, and an address-mapping control device [or memory management unit (MMU)]. These three elements are used in combination to simulate one large random access memory. The mass storage system typically has a much larger capacity than the RAM, but correspondingly, also has a much longer access time.

The mapping between virtual memory and physical memory is typically done in "pages" of memory. A "memory page" is a convenient collection or aggregation of memory locations. Page sizes generally range from one kilo-byte (1 kB) to 8 kB. A 4 kB page size is typical.

Virtual memory functions as follows. The memory management unit maintains a page table which contains an entry for each page of virtual memory currently present in the system RAM. Each entry in the page table contains a physical address representing the start (beginning) address of the physical page in system RAM. The upper or more significant bits of the virtual and physical addresses represent a page number.

On each memory reference by a CPU, the CPU presents a virtual address to the MMU. The MMU then searches the page table for a match to the virtual page number. If the page is found in the page table, then the MMU takes the start address of that page in system RAM and adds to it the lower bits of the virtual address to form a complete physical address. This physical address is then placed on the memory bus and the transaction is completed by an appropriate memory controller.

If the page address is not found in the page table, then this indicates that either the page does not exist or that it is currently stored on the mass storage system. In that case, the MMU will generate an interrupt to the CPU. The interrupt will invoke the operating system's memory manager, which normally controls the MMU. The memory manager will then either create the page or cause it to be swapped from the mass storage system into the system RAM.

Although, there are performance costs resulting from the need to check the page table upon each memory reference and from the movement of pages between the mass storage system and the system RAM, the virtual memory system will simulate a system RAM with a capacity of the mass storage system and with an access time that on average will be close to that of the actual system RAM. In this manner, the virtual memory system can simulate a large system RAM but at a much lower cost.

The preferred embodiment of the present invention is now described with reference to FIGS. 1-4. A 32-bit address-word microprocessor is discussed, but the invention is not limited to such an address size and may be utilized with different word sizes.

The typical microcomputer benefits from the concept of virtual memory. The virtual address space of a central processing unit (CPU) 100 is mapped into the physical address space of a system RAM 300 via the page table function of a memory management unit (MMU) 200 and the page swapping function of the operating system's memory manager. System RAM 300, is a fast, volatile RAM memory and provides the working storage used by CPU 100.

Mass storage 400 may also be available to MMU 200. Mass storage 400 includes a direct access storage device (DASD) 404 and a corresponding DASD controller 402. DASD 404 may be represented by a magnetic or an optical disk.

System RAM 300 is divided into two memory banks: a low-power memory bank 310 and a normal memory bank 320. Low-power memory bank 310 includes a memory controller 312 and a low-power RAM 316. Normal memory bank 320 includes a memory controller 322 and a normal RAM 326.

The RAM microcircuit chips of memories 316 and 326 are available in convenient packages known as Single In-Line Memory Modules or SIMM. For convenience of use, SIMM's are the preferred embodiment of memories 316 and 326.

Memory controllers 312 and 322 each contain both driver circuits and logic circuits. The driver circuits perform the reading from, and writing to, the RAM memory. The logic circuits are responsible for detecting an address reference to, and generating control signals and address data for, each corresponding physical memory location.

Each read from or write to a page of memory is called a memory "reference". The number of references per unit time is the "reference frequency". A private memory 500 is provided for storing memory reference information.

Every page of virtual memory may be represented by a page in system RAM 300 and/or, if a page hasn't been referenced for a relatively long period of time, in mass storage 400. The page table or memory map is maintained by the memory manager and keeps track of where each virtual page is physically represented.

This invention is primarily concerned with reducing the power consumption of system RAM 300 by controlling the placement of the physical pages. The placement is done according to the reference frequency for each particular virtual page.

The more frequently referenced pages are maintained in normal memory 320 in order to achieve optimum performance. Normal RAM 326 of normal memory 320 is a high speed, high power RAM memory. The less frequently used pages of memory are stored in low-power memory 310. Low-power RAM 316 will consume less power and will therefore tend to be slower than normal RAM 326.

This optimization scheme balances the performance cost of migrating a page between the two memory banks with the higher power cost associated with leaving the page in normal memory 320. Power savings are achieved because low-power RAM 316 tends to consume less power than the faster high-power RAM which is conventionally used throughout system RAM 300.

Additional power can be saved in the driver circuits of memory controller 312. The driver circuits of memory controllers 312 and 322 drive both system bus 202 and corresponding SIMM buses 314 and 324, respectively. These driver circuits are responsible for the majority of the power consumed by memory banks 310 and 320. Under normal conditions, the refresh cycle of the RAM and the logic circuits use only a nominal amount of power.

Accordingly, to achieve yet further power savings in low-power memory 310, it is desirable to switch the driver circuits of memory controller 312 off when they are not being used. To permit this, the driver circuits of memory controller 312 are powered independent of the logic circuits and are operable in two states: a first active state and a second standby or sleep state.

In the first active state, the driver circuits function normally and may satisfy a memory reference. In the sleep state, however, power is removed from the driver circuits so that they are passive rather than active circuit elements. In this state, the memory controller is not capable of satisfying a memory reference.

Normally, when a reference is made to a RAM memory, the memory controller logic circuits will decode the physical address received from the MMU and reference the actual memory cells through the driver circuits. If the driver circuits of memory controller 312 are in the sleep state when the CPU makes a reference to a page in low-power memory 310, then the memory controller 312 will be unable to satisfy the request because the driver circuits are inactive. Thus, the logic circuits must be able to sense that a reference has been made and apply power to the driver circuits.

Figure 2:
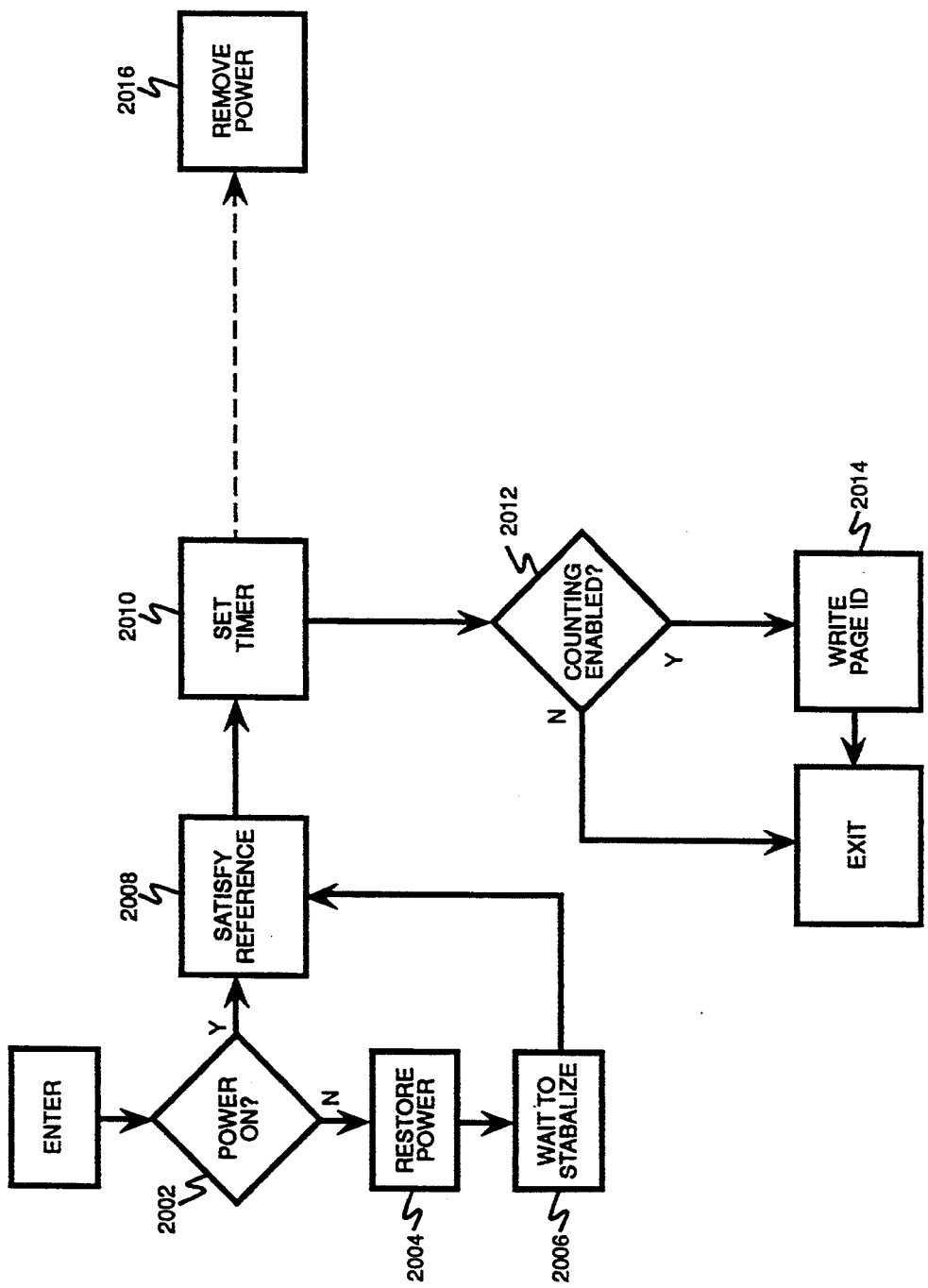
FIG. 2 is a flow chart illustrating the memory reference operation of this invention.

Accordingly, upon receipt of an address referencing low-power memory 310, the logic circuits of memory controller 312 execute the memory reference operation shown in FIG. 2:

(1) if the driver circuits of low-power memory controller 312 are powered-up, then the reference can be satisfied in the usual way (Steps 2002 and 2008);

(2) if the driver circuits of low-power memory controller 312 are not powered-up, then power is restored (Step 2004) and allowed to stabilize (Step 2006) before satisfying the reference (Step 2008);

(3) a hardware timer is set to turn the power to the driver circuits back off after a set interval (Steps 2010 and 2016); and (4) if reference counting is enabled (Step 2012) then the page address is written to the private memory table 500 (Step 2014).

Performance concerns dictate that it is not practical to power down the driver circuits of memory controller 322. Thus, only memory controller 312 need -have the capability of independently powering the driver circuits.

Determination of whether a page belongs in normal memory 320 or in low-power memory 310 is the function of a page placement daemon. The daemon is part of the operating system's memory manager. The daemon is loaded as a background process during system initialization and thereafter remains inactive until invoked by an interrupt. Upon receiving an interrupt, the daemon calculates the reference frequency for each page in low-power memory 310 and then makes a decision based on set criteria on whether to migrate each page to normal memory 320.

In order to make the determination of proper location for a page of memory, the daemon must have access to reference information for each page of memory in low-power memory 310. The preferred way for maintaining a reference count utilizes private memory 500.

Figure 3:
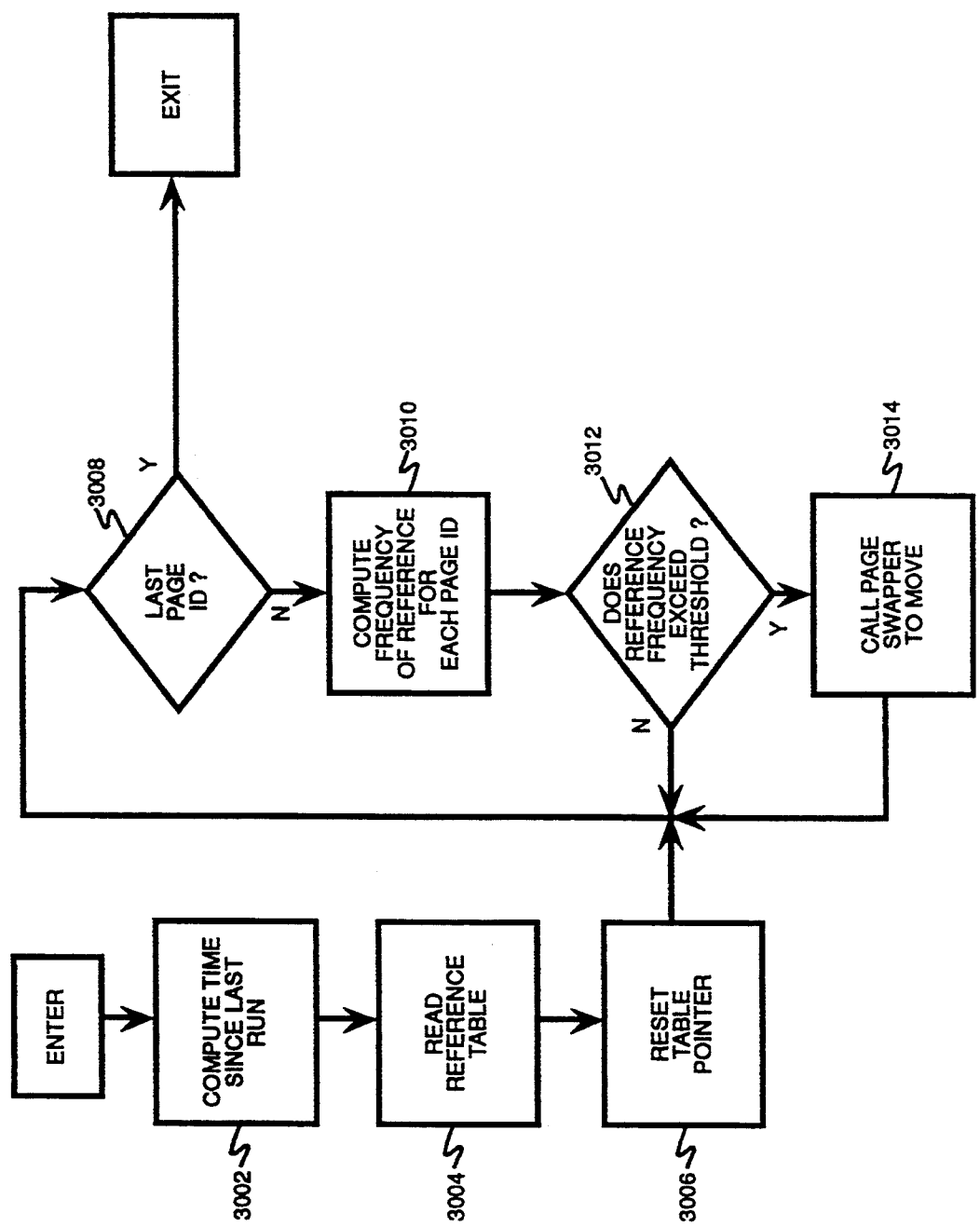
FIG. 3 is a flow chart illustrating the page placement daemon function of this invention.

Private memory 500 is organized as a table for storing page addresses. The daemon does not write to this memory, but may read it and may reset the table pointer. When a reference is made to low-power RAM 316, the page address of the particular page is written to private memory 500 by memory controller 312 at a location indicated by the table pointer for the private memory. For example, given a 4 kB page size with 32 bit addressing, the private memory would be a 100 kB memory organized as a table 20 bits wide. The top (or most significant) 20 bits of the address identify the particular page and would be written into the table by memory controller 312 as the next table entry and the table pointer would be incremented. Periodically, or when the low-power memory controller's private memory 500 is full, memory controller 312 produces a specific interrupt to processor 100. This interrupt invokes the daemon. With reference to FIG. 3, the daemon then performs the following steps:

(1) The daemon computes the time since it was last invoked (Step 3002);
(2) The daemon reads the private memory 500 (Step 3004) and resets the table pointer (Step 3006);
(3) For each unique page identifier in the private memory table, the daemon computes the frequency of reference (Step 3010);
(4) For any and all pages for which the reference frequency exceeds a threshold (Step 3012), the daemon uses the operating system's page table to obtain the actual page number, and then directs the operating system's page swapper to move these pages into normal memory 320 (Step 3014); and
(5) When the last page address is processed, the daemon exits (Step 3008).

If a transfer is made to normal memory 320 and that memory is full, then a page will have to be swapped out to make room for the incoming page. The page to be swapped out may be selected by any number of ad hoc rules or as a function of its frequency of reference.

It is preferred to select the page of normal memory 320 to be swapped to low-power memory 310 as a function of its reference frequency. This could be achieved by having memory controller 322 write page addresses to another private memory, and similarly involving the daemon in the calculations.

When a page must be moved between normal memory 320 and low-power memory 310, the preferred means for making the transfer is the page swapper of the resident operating system. All page-oriented operating systems have a page swapper, which is part of the memory manager.

For this invention, two modifications of the page swapper algorithm are required. First, when the memory manager finds that it must load a page from mass storage, such as DASD 107, into system RAM 300, or when it creates a new page, these pages must initially be loaded/created in normal memory 320. Second, the swapper must accept requests from the daemon to move pages from low-power memory 310 to normal memory 320.

When the page swapper moves a page from low-power memory 310 to normal memory 320, it will normally have to bump a page out of normal memory 320 and into low-power memory 310. As discussed above, it will need to choose which page to move out of normal memory 320. If a means involving a private memory and the daemon is not employed to classify pages of normal memory 320 according to their frequency of reference, then the preferred method is for the page swapper to use the same steps which it employs in deciding when to move a page from system RAM 300 to mass storage.

Figure 4:
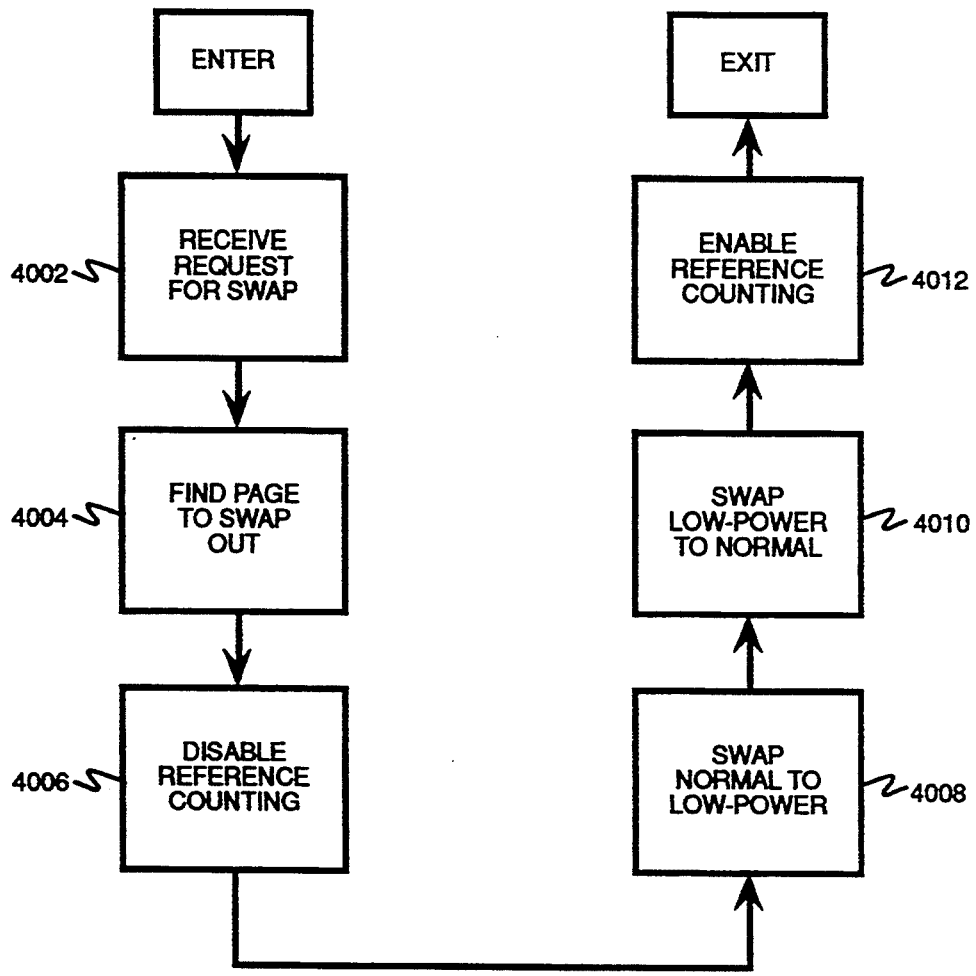
FIG. 4 is a flow chart illustrating the page swapper operation of this invention.

In making a transfer to normal memory 320 which involves a bump of another page to low-power memory 310, the swapper will perform the steps illustrated in FIG. 4:

(1) upon receiving a request (Step 4002), the swapper uses its standard algorithm to select a page to be moved from normal memory 320 to low-power memory 310 (Step 4004);
(2) it disables reference counting in low-power memory controller 312 (Step 4006);
(3) it moves the selected page from normal memory 320 to low-power memory 310 (Step 4008);
(4) it moves the designated page from low-power memory 310 to normal memory 320 (Step 4010);
(5) it enables reference counting in the low-power memory controller 312 (Step 4012); and
(6) it exits.

This strategy assumes that there is considerable locality of physical address references, so that the performance overhead of enabling a driver need occur only infrequently. Thus, although there will be an overhead burden imposed on the processor, after an initial phase in the execution of an application, wherein most of the page movement occurs, a stable distribution will quickly be achieved and thereafter there will be little overhead.

In an alternative embodiment, rather than use private memory 500, the daemon may keep track of references to low-power memory 310 directly in the operating system's page table. In this embodiment, upon sensing a reference to a page of low-power RAM 316, memory controller 312 would produce an interrupt to the daemon.

Upon receiving an interrupt, the daemon will make a decision based on set criteria on how to handle the memory reference. It has two options:

first, if the daemon determines that the page is not referenced with sufficient frequency to justify moving that page to normal memory 320, then the daemon will simply turn on the driver circuits so that the reference can be made and then set a timer which will turn the driver circuits back off after a fixed period;

second, if the daemon determines that the page is referenced with sufficient frequency, then the daemon will turn on the driver circuits, set a timer which will turn the driver circuits back off after a fixed period, and either call the operating system's page swapper which will transfer the page of memory to normal memory 320, or the daemon may make the transfer itself. This alternate embodiment, however, involves numerous additional instructions and will result in an increased overhead burden on CPU 100 relative to the first embodiment.

Although the invention has been described and illustrated with a certain degree of particularity, it is understood that those skilled in the art will recognize a variety of applications and appropriate modifications within the spirit of the invention and the scope of the claims.

What is claimed is:

1. A method for managing a computer memory to conserve power, wherein the computer memory is divided into at least first and second memory banks, and a memory controller comprising a driver circuit section and a logic circuit section is operatively associated with the second memory bank, said method for managing a computer memory to conserve power comprising the steps of:
   counting references to a first page of memory in said second memory bank;
   calculating a reference frequency for said first page of memory;
   comparing said reference frequency to an established criterion; and
   transferring said first page of memory into said first memory bank if said reference frequency exceeds the established criterion;
   counting references to a plurality of pages of memory in said first memory bank;
   calculating a reference frequency for said plurality of pages of memory;.
   selecting a second page of memory from said plurality of pages based upon said reference frequency associated with said selected second page of memos; and
   transferring said second page of memory out of said first memory bank upon said transferring of said first page of memory into said first memory bank.

2. The method of claim 1, further comprising:
   removing power from said driver circuit section when said second memory is not being referenced; and
   applying power to said driver circuit section when said logic circuit section receives a reference to said second memory bank.

3. A low power consumption random access computer memory comprising:
   a multi-level volatile main memory device, including,
      a first main memory bank comprising a first page-oriented volatile random access memory (RAM), configured to store pages of virtual memory, and
      a second main memory bank comprising a second page-oriented volatile RAM which draws less power than said first page-oriented volatile RAM, said second page-oriented volatile RAM configured to store pages of virtual memory;
   a memory manager, electrically coupled to said first and second main memory banks, configured to manage the placement of said pages of memory, wherein more frequently referenced pages are placed in said first main memory bank;
   a private memory for storing page addresses; and
   a memory controller, electrically coupled to said second main memory bank and said private memory, said memory controller having a logic circuit and a driver circuit wherein said driver circuit is powerable separately from said logic circuit, and wherein said logic circuit detects address references to said second main memory bank, and thereafter, writes detected page addresses to said private memory.

4. The apparatus of claim 3, wherein said memory controller further comprises:
   a first signal generator, electrically connected to said logic circuit, for generating a first signal when said logic circuit detects an address reference to said second main memory bank; and
   a second signal generator, electrically connected to said private memory, for generating a second signal upon detecting a full private memory.

5. The apparatus of claim 4, further comprising:
   a switch for enabling power to said driver circuit; and
   a first receiver to receive said first signal and toggle said switch in response thereto.

6. The apparatus of claim 5, further comprising:
   a processor electrically connected to said private memory;
   a second receiver, electrically connected to said processor, to receive said second signal; and
   a timer electrically connected to said processor;
wherein upon receiving said second signal, said processor reads said page addresses from said private memory and establishes a reference count for a specific page of memory, said processor calculates the time elapsed since receipt of a previous second signal, said processor calculates a frequency of reference for said specific page of memory, and said processor compares said frequency of reference to an established criterion.

7. A method for reducing power consumption in a page-oriented computer memory comprising a multi-level volatile memory device having a first main memory bank comprising first volatile random access memory (RAM) and configured to store pages of virtual memory, and a second main memory bank comprising second volatile RAM configured to store pages of virtual memory, the second volatile RAM drawing less power than the first volatile RAM, the method comprising steps of:
   determining reference frequencies for pages of the computer memory,
   maintaining, with a memory manager, more frequently referenced pages in the first main memory bank, wherein said more frequently referenced pages are identified based on said reference frequencies;
   maintaining, with said memory manager, less frequently referenced pages in the second main memory bank, wherein said less frequently referenced pages are identified based on said reference frequencies;
   controlling said memory with a memory controller comprising a logic part and a driver part, wherein the driver part is powerable independent from the logic part;
   switching off power to said driver part; and
   switching on power to said driver part when said logic part detects a reference to said second memory.

8. A low power consumption computer memory, comprising:

a volatile computer main memory divided into at least first and second main memory banks, said first main memory bank comprising a first volatile random access memory (RAM) configured to store pages of virtual memory and said second main memory bank comprising a second volatile RAM configured to store pages of virtual memory;

a memory controller including,
    a driver circuit electrically connected to said second main memory bank, said driver circuit configured for writing to and reading from said second main memory bank, and
    logic means for detecting an address reference to, and generating control signals and address data for, said second main memory bank;

memory manager means, electrically connected to said first and second main memory banks, for managing placement of said pages of virtual memory according to a private memory map such that more frequently referenced pages are maintained in said first main memory bank;

means for controlling power to said driver circuit independent of power to said logic means, whereby said driver circuit is operable in a first active state and a second unpowered state;

generating means for generating a signal when said logic means detects an address reference to said second main memory bank; and receiving means for receiving said signal and accordingly instructing said driver circuit to switch to said first active state, said receiving means being electrically coupled to said generating means, whereby said second main memory bank may be referenced.

9. The apparatus of claim 8, wherein said memory manager means comprises:

counting means for counting references to a specific page of memory in said second memory bank;

calculating means, electrically connected to said counting means, for calculating a frequency of reference from reference count data maintained by said counting means;

comparing means, electrically connected to said calculating means, for comparing said frequency of reference to an established criterion; and transfer means, electrically connected to said comparing means, for moving said specific page of memory from said second memory bank to said first memory bank when said frequency of reference exceeds said established criterion.

* * * * *